(12) United States Patent
Song

(10) Patent No.: US 8,947,132 B2
(45) Date of Patent: Feb. 3, 2015

(54) SEMICONDUCTOR DEVICE AND SEMICONDUCTOR SYSTEM INCLUDING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/090,858

(22) Filed: Nov. 26, 2013

(65) Prior Publication Data
US 2014/0368238 A1    Dec. 18, 2014

(30) Foreign Application Priority Data

Jun. 17, 2013  (KR) ........................ 10-2013-0068885

(51) Int. Cl.
*H03B 1/00* (2006.01)
*H03K 3/00* (2006.01)
*G05F 3/08* (2006.01)

(52) U.S. Cl.
CPC ....................................... *G05F 3/08* (2013.01)
USPC ........... 327/108; 327/109; 327/110; 327/111; 327/112

(58) Field of Classification Search
USPC .................................. 327/108–112
See application file for complete search history.

(56) References Cited

U.S. PATENT DOCUMENTS

| 2004/0008059 | A1* | 1/2004 | Chen et al. ..................... 327/112 |
| 2006/0186935 | A1* | 8/2006 | Hwang et al. ................... 327/112 |
| 2007/0103209 | A1* | 5/2007 | Lee ................................. 327/112 |
| 2009/0161469 | A1* | 6/2009 | Kobayashi ...................... 365/222 |
| 2009/0230996 | A1* | 9/2009 | Ko et al. ......................... 327/108 |
| 2010/0109683 | A1* | 5/2010 | Nishioka ........................ 324/691 |
| 2010/0194448 | A1* | 8/2010 | Lee ................................. 327/109 |
| 2010/0244905 | A1* | 9/2010 | Kim et al. ....................... 327/108 |
| 2012/0025871 | A1* | 2/2012 | Song .............................. 327/108 |
| 2012/0062280 | A1* | 3/2012 | Yang et al. ...................... 327/108 |
| 2013/0163647 | A1* | 6/2013 | Hagisawa et al. .............. 375/219 |

FOREIGN PATENT DOCUMENTS

KR    1020120080803    7/2012

* cited by examiner

*Primary Examiner* — Adam Houston
(74) *Attorney, Agent, or Firm* — IP&T Group LLP

(57) ABSTRACT

A semiconductor device includes a normal code generation unit capable of generating a normal code, a test code output unit capable of storing a plurality of preliminary test codes to output a test code in response to a test control signal, and a reference voltage generation unit capable of generating a normal reference voltage in a normal operation mode and generating a test reference voltage in a test operation mode in response to the normal code and the test code.

20 Claims, 3 Drawing Sheets

SEMICONDUCTOR DEVICE AND SEMICONDUCTOR SYSTEM INCLUDING THE SAME

CROSS-REFERENCE TO RELATED APPLICATIONS

The present application claims priority of Korean Patent. Application No. 10-2013-0068885, filed on Jun. 17, 2013, which is incorporated herein by reference in its entirety.

BACKGROUND

1. Field

Exemplary embodiments relate to a semiconductor design technology, and more particularly, to a semiconductor device having a reference voltage generation circuit and a semiconductor system including the same.

2. Description of the Related Art

A reference voltage generation circuit is generally used in a semiconductor device such as a Dynamic Random Access Memory (DRAM) device and generates a reference voltage by using an external power supply voltage.

The reference voltage generation circuit generates the reference voltage maintaining a constant voltage level irrespective of process, voltage and temperature (PVT) variations.

A mode register set (MRS) is used for setting a voltage level of a reference voltage in a normal operation mode. The MRS is set by an MRS code and an MRS setting command inputted through address pins. The voltage level of a reference voltage is determined by the MRS code.

Meanwhile, the MRS performs an MRS setting operation in the normal operation mode after a power-up operation.

When a test operation is performed before the MRS setting operation, the conventional semiconductor device uses a normal reference voltage used in the normal operation mode as a test reference voltage used in a test operation mode. However, at this time, the normal reference voltage does not reach a target voltage level of the test operation mode.

SUMMARY

Various exemplary embodiments are directed to a semiconductor device that may provide a test reference voltage irrespective of whether an MRS setting operation is performed or not.

In accordance with an exemplary embodiment of the present invention, a semiconductor device may include a normal code generation unit capable of generating a normal code, a test code output unit capable of storing a plurality of preliminary test codes to output a test code in response to a test control signal, and a reference voltage generation unit capable of generating a normal reference voltage in a normal operation mode and generating a test reference voltage in a test operation mode in response to the normal code and the test code.

In accordance with an exemplary embodiment of the present invention, a semiconductor device may include a normal code generation unit capable of generating a normal code, a normal voltage generation unit capable of generating a normal voltage based on the normal code, a test voltage generation unit capable of generating a test voltage in response to a test control signal, and a multiplexer capable of outputting the test voltage as a test reference voltage in response to a test mode signal activated during a test operation mode and capable of outputting the normal voltage as a normal reference voltage in response to the test mode signal inactivated during a normal operation mode.

In accordance with another exemplary embodiment of the present invention, a semiconductor system may include a controller capable of providing an MRS code and a test control signal to a semiconductor device, and the semiconductor device capable of generating a normal reference voltage in response to the MRS code in a normal operation mode and capable of generating a test reference voltage in response to the test control signal in a test operation mode irrespective of whether an MRS setting operation is performed or not.

Exemplary embodiments of the present invention may provide a test reference voltage used in a test operation mode irrespective of whether a mode register set (MRS) is set or not. Although a test operation is performed before the MRS is set, the test reference voltage maintains a target voltage level of a test operation mode.

As a consequence, it may be possible to effectively support an operation with reliability even in the semiconductor device and a semiconductor system including the same.

DETAILED DESCRIPTION

Figure 1:
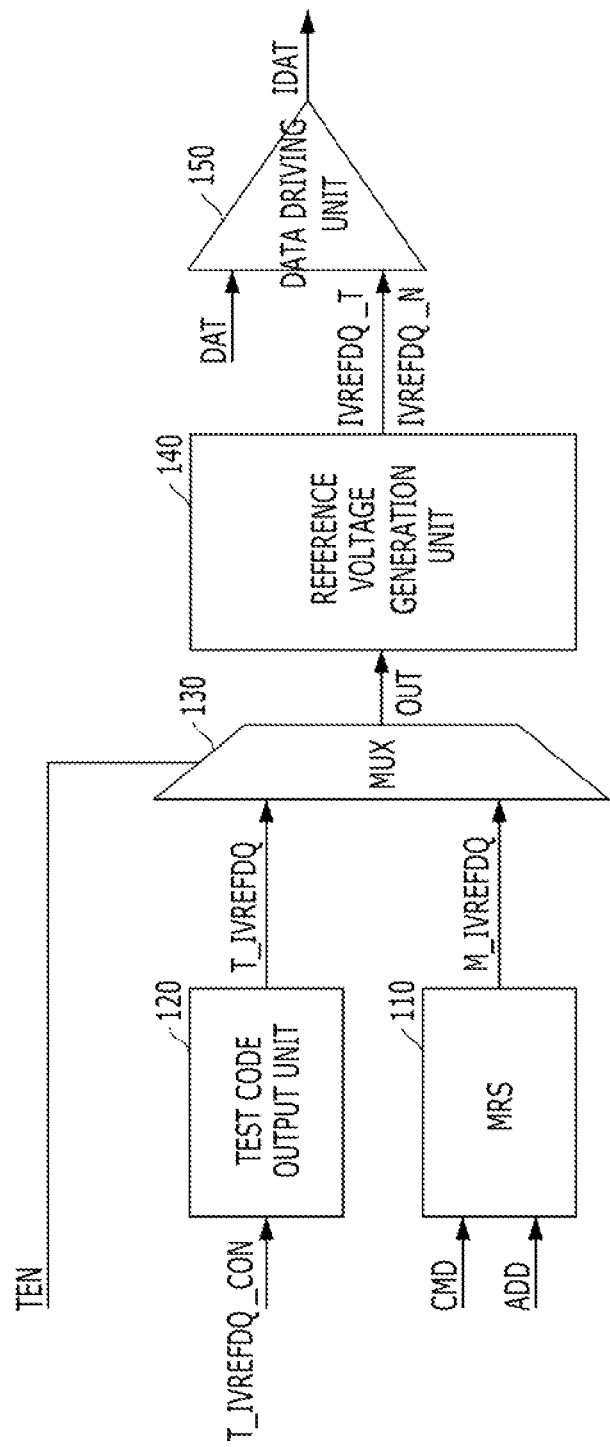
FIG. 1 is a block diagram illustrating an exemplary semiconductor device in accordance with an embodiment of the present invention.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those ski lied in the art. Throughout the disclosure, reference numerals correspond directly to the like numbered parts in the various figures and embodiments of the present invention. Also, it is noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating an exemplary semiconductor device in accordance with an embodiment of the present invention.

Referring to FIG. 1, the semiconductor device includes a mode register set (MRS) 110, a test code output unit 120, a multiplexer 130, a reference voltage generation unit 140, and a data driving unit 150.

The MRS 110 generates a normal code M_IVREFDQ for setting a normal reference voltage IVREFDQ_N used in a normal operation mode based on a command signal CMD and an address signal ADD.

The test code output unit 120 stores a plurality of preliminary test codes for setting a test reference voltage IVREFDQ_T used in a test operation mode, and outputs a test code T_IVREFDQ based on a test control signal T_IVREFDQ_CON. The test control signal T_IVREFDQ_CON is used for setting the test reference voltage IVREFDQ_T to have a specific voltage level and may be set by a user.

The multiplexer 130 outputs an output signal MUX by selecting outputs one of the normal code M_IVREFDQ from the MRS 110 and the test code T_IVREFDQ from the test code output unit 120 in response to a test mode signal TEN. The test mode signal TEN is activated during the test operation mode and is inactivated during the normal operation mode. The multiplexer 130 outputs the test code T_IVREFDQ as the output signal OUT when the test mode signal TEN is activated and outputs the normal code M_IVREFDQ as the output signal OUT when the test mode signal TEN is inactivated.

The reference voltage generation unit 140 generates the normal reference voltage IVREFDQ_N and the test reference voltage IVREFDQ_T in response to the output signal OUT of the multiplexer 130. The reference voltage generation unit 140 may generate a plurality of divided voltages based on a division ratio between supply voltages, and outputs one of the divided voltages as the test reference voltage IVREFDQ_T or the normal reference voltage IVREFDQ_N in response to the output signal OUT from the multiplexer 130.

The data driving unit 150 drives input data DAT from outside to a voltage level of the normal reference voltage IVREFDQ_N or a voltage level of the test reference voltage IVREFDQ_T from the reference voltage generation unit 140 to output the driven input data DAT as internal data IDAT.

Hereinafter, the operation of the semiconductor is described as follows.

In the normal operation mode, the multiplexer 130 selects the normal code M_IVREFDQ outputted from the MRS 110, and the reference voltage generation unit 140 generates the normal reference voltage IVREFDQ_N having a voltage level corresponding to the normal code M_IVREFDQ. The data driving unit 150 drives the input data DAT to the voltage level of the normal reference voltage IVREFDQ_N to output the internal data IDAT. The voltage level of the normal reference voltage IVREFDQ_N is optimized by Signal Integrity (SI) of the data driving unit 150.

In the test mode, the multiplexer 130 selects the test code T_IVREFDQ outputted from the test code output unit 120, and the reference voltage generation unit 140 generates the test reference voltage IVREFDQ_T having a voltage level corresponding to the predetermined test code T_IVREFDQ. The data driving unit 150 drives the input data DAT to the voltage level of the test reference voltage IVREFDQ_T to output the internal data IDAT. The voltage level of the test reference voltage IVREFDQ_T is optimized by the Signal Integrity (SI) of the data driving unit 150. The voltage level of the test reference voltage IVREFDQ_T may be set by user.

As described above, in the test mode, since the test reference voltage IVREFDQ_T is generated based on the predetermined test code T_IVREVDQ not the normal code M_IVREFDQ set by the MRS 110, the input data DAT is driven to the voltage level of the test reference voltage IVREFDQ_T.

Figure 2:
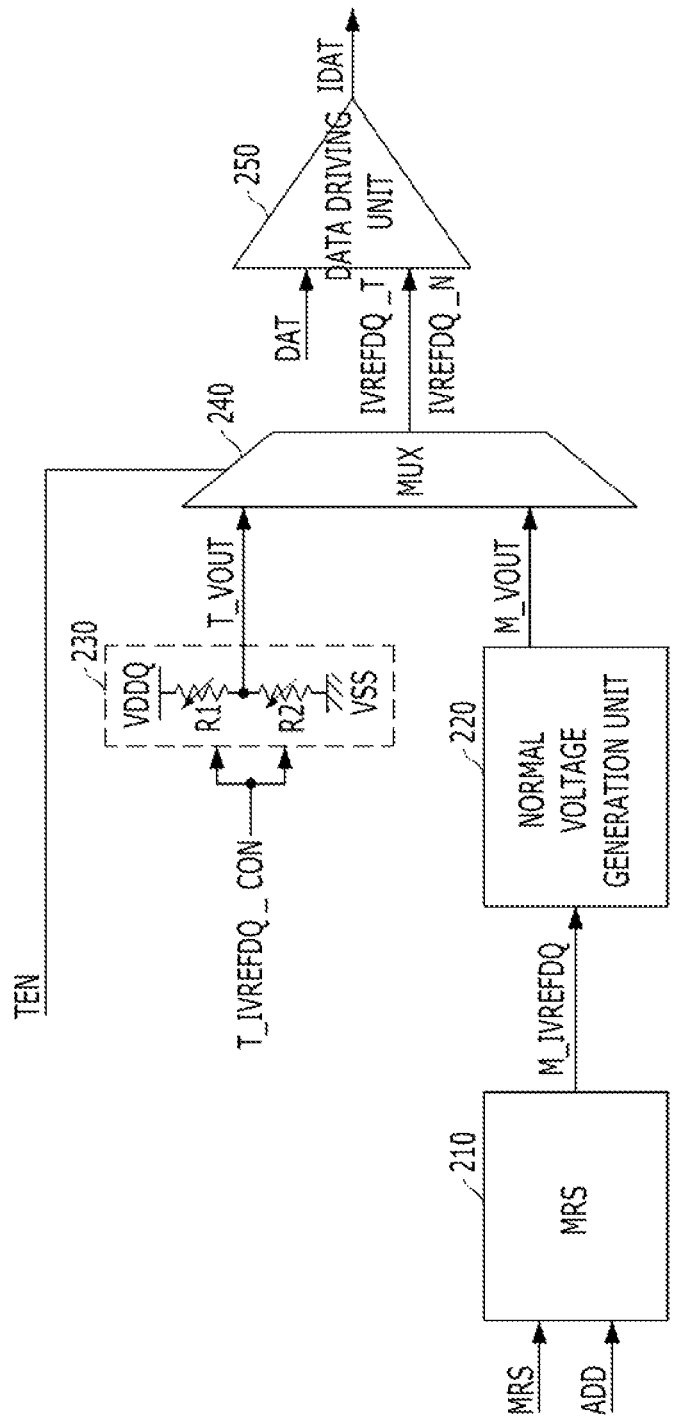
FIG. 2 is a block diagram illustrating an exemplary semiconductor device in accordance with an embodiment of the present invention.

FIG. 2 is a block diagram illustrating an exemplary semiconductor device in accordance with another embodiment of the present invention.

Referring to FIG. 2, the semiconductor device includes a mode register set (MRS) 210, a normal voltage generation unit 220, a test voltage generation unit 230, a multiplexer 240, and a data driving unit 250.

The MRS 210 generates a normal code M_IVREFDQ for setting a normal reference voltage IVREFDQ_N used in a normal operation mode based on a command signal CMD and an address signal ADD.

The normal voltage generation unit 220 generates a normal voltage M_VOUT corresponding to the normal code M_IVREFDQ from the MRS 210.

The test voltage generation unit 230 generates a test voltage T_VOUT used in a test operation mode. The test voltage generation unit 230 includes resisters R1 and R2. The resisters R1 and R2 are coupled in series between a supply voltage (VDDQ) terminal and a ground voltage (VSS) terminal. The test voltage T_VOUT is outputted from a common node of the resisters R1 and R2 based on a division ratio of R2/(R1+R2). Furthermore, in the exemplary embodiment, the resisters R1 and R2 may be implemented with variable resisters, and resistance of the resisters R1 and R2 may be controlled by a test control signal T_IVREFDQ_CON. Accordingly, a voltage level of the test voltage T_VOUT may be varied in response to the test control signal T_IVREFDQ_CON.

The multiplexer 240 outputs a test reference voltage IVREFDQ_T or a normal reference voltage IVREFDQ_N by selecting one of the normal voltage M_VOUT from the normal voltage generation unit 220 and the test voltage T_VOUT from the test voltage generation unit 230 in response to a test mode signal TEN. The test mode signal TEN is activated during the test operation mode, and inactivated during the normal operation mode. The multiplexer 240 outputs the test voltage T_VOUT as the test reference voltage IVREFDQ_T when the test mode signal TEN is activated. The multiplexer 240 outputs the normal voltage M_VOUT as the normal reference voltage IVREFDQ_N when the test mode signal TEN is inactivated.

The data driving unit 250 drives input data DAT from outside to a voltage level of the normal reference voltage IVREFDQ_N or a voltage level of the test reference voltage IVREFDQ_T to output the driven input data DAT as internal data IDAT.

Hereinafter, the operations of the semiconductor are described as follows.

In the normal operation mode, the MRS 210 outputs the normal code M_IVREFDQ and the normal voltage generation unit 220 generates the normal voltage M_VOUT having a voltage level corresponding to the normal code M_IVREFDQ. The multiplexer 240 selects the normal voltage M_VOUT to output the normal reference voltage IVREFDQ_N when the test mode signal TEN is inactivated. The data driving unit 250 drives the input data DAT to a voltage level of the normal reference voltage IVREFDQ_N to output the internal data IDAT. The voltage level of the normal reference voltage IVREFDQ_N is optimized by a Signal Integrity (SI) of the data driving unit 250.

In the test operation mode, the test voltage generation unit 230 generates the test voltage T_VOUT. The multiplexer 240 selects the test voltage T_VOUT to output the test reference voltage IVREFDQ_T. The data driving unit 250 drives the input data DAT to the voltage level of the test reference voltage IVREFDQ_T to output the internal data IDAT. The voltage level of the test reference voltage IVREFDQ_T is optimized by the Signal Integrity (SI) of the data driving unit 250. The voltage level of the test reference voltage IVREFDQ_T may be set by user.

As described above, in the test mode, since the test reference voltage IVREFDQ_T is generated based on the predetermined test code T_IVREVDQ not the normal code M_IVREFDQ set by the MRS 210, the input data DAT is driven to the voltage level of the test reference voltage IVREFDQ_T.

Figure 3:
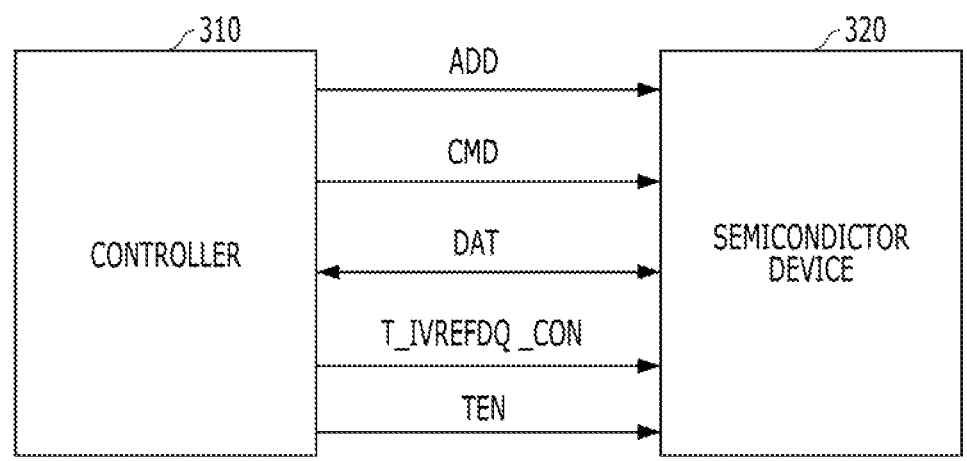
FIG. 3 is a block diagram illustrating an exemplary semiconductor system in accordance with the embodiments of the present invention.

FIG. 3 is a block diagram illustrating an exemplary semiconductor system.

Referring to FIG. 3, the semiconductor system includes a controller 310 and a semiconductor device 320. For reference, the semiconductor device 320 in FIG. 3 may be implemented with the semiconductor devices shown in FIGS. 1 and 2, respectively.

The controller 310 transmits a test control signal T_IVREFDQ_CON for setting a test reference voltage ('IVREFDQ_T' of FIGS. 1 and 2) used in a test operation mode to the semiconductor device 320. The test control signal T_IVREFDQ_CON is provided to control a voltage level of the test reference voltage IVREFDQ_T. The controller 310 transmits a test mode signal TEN denoting the test operation mode to the semiconductor device 320. The test mode signal TEN is activated during the test operation mode, and inactivated during a normal operation mode. The controller 310 transmits a command signal CMD and an address signal ADD for setting a normal reference voltage ('IVREFDQ_N' of FIGS. 1 and 2) used in a normal operation mode to the semiconductor device 320.

The semiconductor device 320 may receive the test control signal T_IVREFDQ_CON through air address pin from the controller 310.

In the normal mode, the semiconductor device 320 generates the normal reference voltage IVREFDQ_N used in the normal operation mode based on the command signal CMD and the address signal ADD. The semiconductor device 320 drives input data DAT ('DAT' of FIGS. 1 and 2) received from the controller 310 to a voltage level of the normal reference voltage IVREFDQ_N. The semiconductor device 320 uses the driven input data DAT as internal data IDAT ('IDAT' of FIGS. 1 and 2).

In the test operation mode, the semiconductor device 320 generates the test reference voltage IVREFDQ_T used in the test operation mode based on the test control signal T_IVREFDQ_CON. The semiconductor device 320 drives the input data DAT received from the controller 310 to a voltage level of the test reference voltage IVREFDQ_T. The semiconductor device 320 uses the driven input data DAT as the internal data IDAT.

As described above, the semiconductor device 320 generates the test reference voltage IVREFDQ_T used in the test operation mode based on the test control signal T_IVREFDQ_CON input from the controller 310. That is, the semiconductor device 320 uses the test reference voltage IVREFDQ_T, not the normal reference voltage IVREFDQ_N, in the test operation mode.

The test control signal T_IVREFDQ_CON may control the voltage level of the test reference voltage IVREFDQ_T by varying resistance of resistors R1 and R1 as shown in FIG. 2, or by generating the predetermined test code T_IVREFDQ as shown in FIG. 1, in response to the test control signal T_IVREFDQ_CON.

As is apparent from the above descriptions, in the embodiments, exemplary embodiments of the present invention may provide a test reference voltage used in a test operation mode irrespective of whether a mode register set (MRS) is set or not, Although a test operation is performed before the MRS is set, the test reference voltage maintains a target voltage level of the test operation mode.

As a consequence, it may be possible to effectively support an operation with reliability even in the semiconductor device and a semiconductor system including the same.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
    a normal code generation unit capable of generating a normal code;
    a test code output unit capable of storing a plurality of preliminary test codes to output a test code in response to a test control signal; and
    a reference voltage generation unit capable of generating a normal reference voltage in a normal operation mode and generating a test reference voltage in a test operation mode in response to the normal code and the test code.

2. The semiconductor device of claim 1, further comprising:
    a multiplexer capable of selecting one of the normal code and the test code in response to a test mode signal and outputting the selected one to the reference voltage generation unit, the test mode signal being activated during the test operation mode and inactivated during the normal operation mode.

3. The semiconductor device of claim 1, further comprising:
    a data driving unit capable of driving input data to a voltage level of the normal reference voltage or a voltage level of the test reference voltage.

4. The semiconductor device of claim 1, wherein the normal code generation unit includes a mode register set (MRS) for setting the normal code corresponding to the normal reference voltage.

5. The semiconductor device of claim 1, wherein the test control signal is used for setting the test reference voltage used in the test operation mode.

6. The semiconductor device of claim 1, wherein the test code output unit outputs the test code irrespective of whether an MRS setting operation is performed or not.

7. A semiconductor device comprising:
    a normal code generation unit capable of generating a normal code;
    a normal voltage generation unit capable of generating a normal voltage based on the normal code;
    a test voltage generation unit capable of generating a test voltage in response to a test control signal; and
    a multiplexer capable of outputting the test voltage as a test reference voltage in response to a test mode signal activated during a test operation mode and capable of outputting the normal voltage as a normal reference voltage in response to the test mode signal inactivated during a normal operation mode.

8. The semiconductor device of claim 7, further comprising:
    a data driving unit capable of driving input data to a voltage level of the test reference voltage or a voltage level of the normal reference voltage.

9. The semiconductor device of claim 7, wherein the normal code generation unit includes a mode register set (MRS) for setting the normal code corresponding to the normal reference voltage.

10. The semiconductor device of claim 7, wherein the test control signal is used for setting the test reference voltage used in the test operation mode.

11. The semiconductor device of claim 7, wherein the test voltage generation unit includes a plurality of variable resistors coupled in series between a first voltage terminal and a second voltage terminal.

12. The semiconductor device of claim 11, wherein resistance of the plurality of variable resistors is controlled in response to, the test control signal.

13. The semiconductor device of claim 8, wherein the test voltage generation unit outputs the test voltage irrespective of whether an MRS setting operation is performed or not.

14. A semiconductor system comprising:
a controller capable of providing an MRS code and a test control signal to a semiconductor device; and
the semiconductor device capable of generating a normal reference voltage in response to the MRS code in a normal operation mode and capable of generating a test reference voltage in response to the test control signal in a test operation mode irrespective of whether an MRS setting operation is performed or not.

15. The semiconductor system of claim 14, wherein the semiconductor device comprises:
a normal code generation unit capable of generating a normal code;
a test code output unit capable of storing a plurality of preliminary test codes to output a test code in response to a test control signal; and
a reference voltage generation unit capable of generating the normal reference voltage in the normal operation mode and generating the test reference voltage in the test operation mode in response to the normal code and the test code.

16. The semiconductor system of claim 15, wherein the semiconductor device further comprises:
a multiplexer capable of selecting one of the normal code and the test code in response to a test mode signal and outputting the selected one to the reference voltage generation unit, the test mode signal being activated during the test operation mode and inactivated during the normal operation mode.

17. The semiconductor system of claim 15, wherein the semiconductor device further comprises:
a data driving unit capable of driving input data to a voltage level of the normal reference voltage or a voltage level of the test reference voltage.

18. The semiconductor system of claim 14, wherein the semiconductor device comprises:
a normal code generation unit capable of generating a normal code;
a normal voltage generation unit capable of generating a normal voltage based on the normal code;
a test voltage generation unit capable of generating a test voltage in response to a test control signal;
a multiplexer capable of outputting the test voltage as a test reference voltage in response to a test mode signal activated during a test operation mode and outputting the normal voltage as a normal reference voltage in response to the test mode signal inactivated during a normal operation mode.

19. The semiconductor system of claim 18, wherein the semiconductor device further comprises:
a data driving unit capable of driving input data to a voltage level of the test reference voltage or a voltage level of the normal reference voltage.

20. The semiconductor system of claim 18, wherein the test voltage generation unit includes a plurality of variable resistors coupled in series between a first voltage terminal and a second voltage terminal.

* * * * *